United States Patent [19]

Glass et al.

[11] 4,243,697
[45] Jan. 6, 1981

[54] SELF BIASED FERRITE RESONATORS

[75] Inventors: Howard L. Glass, Orange; Jiin-Herny W. Liaw; Tsutumo Kobayashi, both of Placentia, all of Calif.

[73] Assignee: The United States of America as represented by the Secretary of the Air Force, Washington, D.C.

[21] Appl. No.: 20,299

[22] Filed: Mar. 14, 1979

[51] Int. Cl.³ .................. C04B 35/26; H01F 1/10; B05D 5/12
[52] U.S. Cl. .................. 427/47; 252/62.57; 252/62.58; 252/62.63; 252/62.64; 423/593; 427/126.6; 427/127; 428/539; 428/900
[58] Field of Search .................. 428/538, 539, 900; 252/62.64, 62.58, 62.57, 62.63; 423/593; 427/47, 127, 126

[56] References Cited

U.S. PATENT DOCUMENTS

| | | | |
|---|---|---|---|
| 2,946,753 | 7/1960 | Jonker et al. | 252/62.58 |
| 3,093,453 | 6/1963 | Frei et al. | 252/62.63 X |
| 3,113,927 | 12/1963 | Cochardt | 252/62.63 X |
| 3,114,715 | 12/1963 | Brockman et al. | 252/62.58 X |
| 3,498,836 | 3/1970 | Gambino | 252/62.64 X |
| 3,770,639 | 11/1973 | Okazaki et al. | 252/62.63 X |
| 3,906,404 | 9/1975 | Dixon | 333/17 |
| 3,959,006 | 5/1976 | Herrnring et al. | 252/62.57 X |
| 4,027,074 | 5/1977 | Cross et al. | 427/47 X |
| 4,050,038 | 9/1977 | Noguchi et al. | 333/1.1 |
| 4,093,781 | 6/1978 | Heinz et al. | 428/900 X |
| 4,122,418 | 10/1978 | Nagao | 333/82 R |
| 4,174,421 | 11/1979 | Nishiyama et al. | 428/539 X |
| 4,177,321 | 12/1979 | Nishizawa | 428/539 X |
| 4,182,793 | 1/1980 | Nishiyama et al. | 428/539 X |
| 4,183,999 | 1/1980 | Ota et al. | 428/539 X |
| 4,189,521 | 2/1980 | Glass et al. | 428/539 |

OTHER PUBLICATIONS

IEEE Transactions on Magnetics, Glass et al., Sep. 1977, vol. Mag-13, No. 5, pp. 1241-1243.

Primary Examiner—Harold Ansher
Attorney, Agent, or Firm—Donald J. Singer; William J. O'Brien

[57] ABSTRACT

A method for preparing M-type hexagonal ferrite single crystals for use as self-biased ferrite resonators. M-type ($BaO.6Fe_2O_3$) ferrite crystals are grown on a [111] Mg (In, Ga)$_2$O$_4$ substrate using liquid phase epitaxial techniques. The substrate is immersed into a solute of (BaO, $Fe_2O_3$ and ZnO) dissolved in a molten flux of molten (BaO and $B_2O_3$) maintained in a supersaturated condition.

1 Claim, 1 Drawing Figure

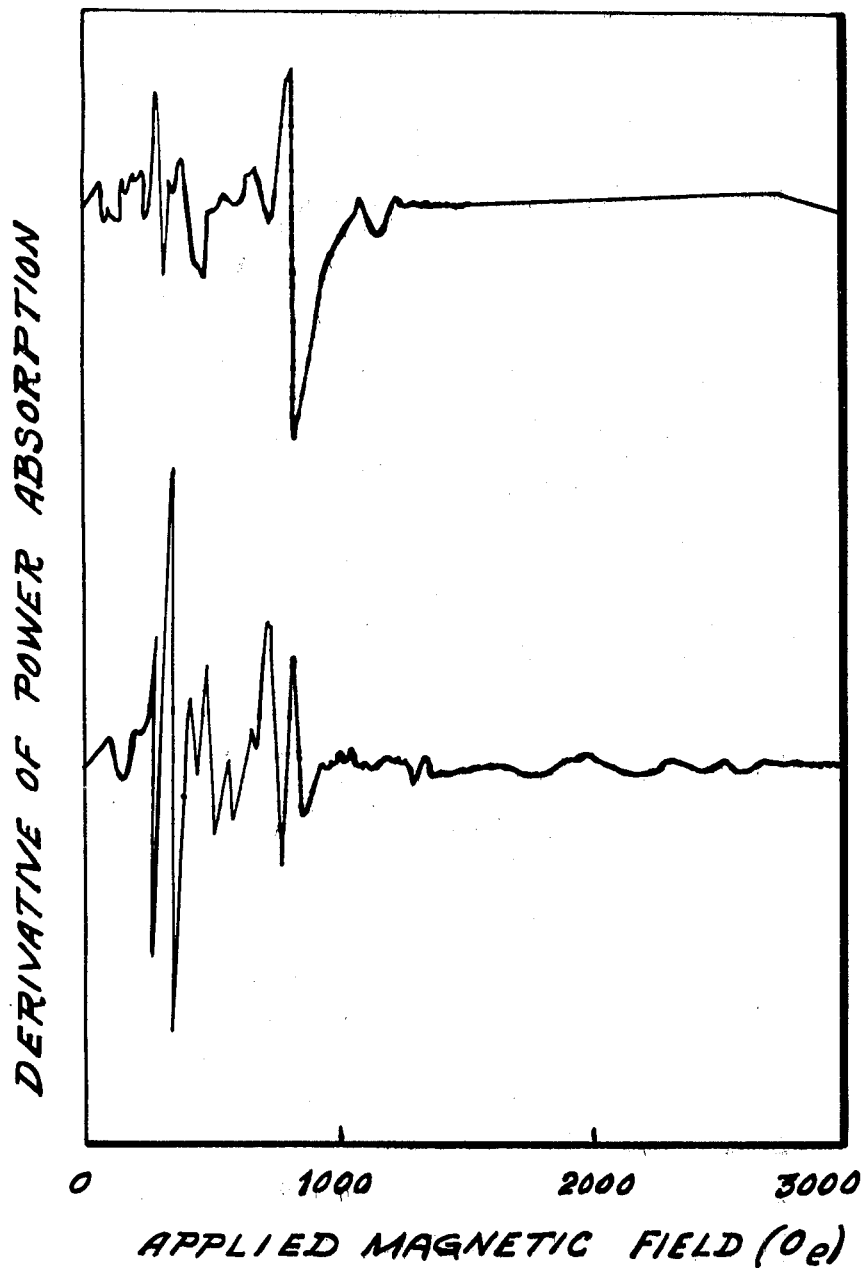

SELF BIASED FERRITE RESONATORS

STATEMENT OF GOVERNMENT INTEREST

The invention described herein may be manufactured and used by or for the Government for governmental purposes without the payment of any royalty thereon.

BACKGROUND OF THE INVENTION

This invention relates to ferrite resonators. More particularly, this invention relates to self biased ferrite resonators composed of hexagonal ferrites and to a process for their fabrication.

Single crystal hexagonal ferrites are characterized by having high uniaxial anisotropies combined with low loss characteristics which makes them especially valuable for use in microwave and millimeter-wave resonators. Generally, a ferrite resonator must be biased by an external magnetic field. The bias field serves two functions: to saturate the magnetization and to set the center frequency. However, the large anistropy field exhibited by hexogonal ferrites permits high frequency resonant devices to be operated with only a very modest external magnetic bias field.

Unfortunately, it is very difficult to prepare high quality device material by conventional methods that is capable of being maintained in a metastable state of magnetic saturation with zero, or near zero, applied field. This is especially true when growing ferrites in single crystal form. Single crystals, rather than ceramic type ferrites, provide the lowest losses and, therefore, the narrowest resonance line widths.

The growth of hexagonal ferrite single crystals has received considerable attention with a wide ranging research effort generated in an attempt to grow high quality crystals. The difficulties in growing big quality material arise both from intrinsic characteristics of the hexagonal ferrites and from limitations of the crystal growth methods. For use in devices, bulk crystals must have uniform composition and be free of defects. The crystals must be fabricated into special shapes, such as spheres or rods, having microscopically smooth surfaces.

Growth techniques which have proved to be somewhat successful are the flux methods, either by slow cooling with spontaneous multiple nucleation or by top-seeding. These methods are similar to those used commercially to grow YIG (yttrium iron garnet) ferrite bulk crystals for microwave devices. However, the hexagonal ferrites are not as easy to work with as YIG. It is much more difficult to grow homogeneous, high quality single crystals of hexagonal ferrites and it is considerably more difficult to fabricate these crystals into the well polished configurations needed in devices. Another method which has achieved an even greater degree of success is the isothermal dipping method of liquid phase epitaxy, otherwise referred to as the LPE method. This method resembles the top seeding method and is basically a flux or solution growth technique.

In order to achieve the objectives of this invention and overcome the problems encountered in previous attempts at growing high quality hexagonal ferrite single crystals, it was found necessary to provide very carefully controlled LPE growth conditions and carefully preselect specific processing parameters. With proper selection and careful control, single crystal ferrites could be grown that exhibited the necessary strong uniaxial anisotropy required for the resonators contemplated by this invention.

SUMMARY OF THE INVENTION

The present invention concerns itself with hexagonal ferrite and to a method for preparing single crystal ferrites that are uniquely capable of maintaining a metastable state of magnetic saturation without the necessity of applying bias through an external magnetic means. The attainment of the invention is accomplished by growing M-type hexagonal ferrite single crystals as a layer on a particular substrate using carefully controlled, preselected processing conditions. By proper selection of the ferrite growth conditions, the internal magnetic saturation can be adjusted in order to provide a desired center frequency.

The ferrite layer is grown using the isothermal dipping method of LPE (liquid phase epitaxy). The method is basically a flux or solution growth technique in which a solution is maintained in a supercooled state with respect to its ferrite constituents. A substrate is then dipped into the solution and held immersed at a constant temperature. No temperature gradient is impressed and the substrate is rotated to promote mixing of the solution and to minimize the effects of unintended gradients. Since the solution is supercooled, ferrite deposits on the substrate. After an appropriate time, usually 1 to 3 hours, the sample is removed from the solution and cleaned in hot dilute acetic or nitric acid to remove non-ferrite residues.

In the isothermal dipping process of this invention, a solute containing $BaO$, $Fe_2O_3$ and $ZnO$ is dissolved in a solvent or flux containing molten $BaCO_3$ and $B_2O_3$. The solution or melt is homogenized at a high temperature and then cooled until a supersaturated state is achieved. While maintaining a constant temperature, a pre-heated [111] oriented $Mg(In,Ga)_2O_4$ substrate crystal is immersed in the supersaturated melt. The substrate is kept in the melt for a suitable period of time, several minutes to several hours, during which a hexagonal ferrite layer is deposited. The substrate, with its deposit, is then removed from the melt and cleaned in hot dilute acetic acid. By proper selection and control of pre-specified ferrite growth conditions, single crystal ferrites are grown which possess the requisite high uniaxial anisotropy required for maintaining the ferrite crystal in a metastable state of magnetic saturation without the necessity of using an external biasing magnetic field.

Accordingly, the primary object of this invention is to provide a process for the preparation of epitaxial ferrites which can be maintained in a metastable state of magnetic saturation with zero, or near zero, applied field.

Another object of this invention is to provide a method for the preparation of small ferrite single crystals which possess a strong uniaxial anisotropy.

Still another object of this invention is to provide a method for preparing hexagonal ferrite single crystals characterized to the extent that there is an absence of centers where magnetic domains can easily nucleate.

The above and still other objects and advantages of the present invention will become more readily apparent upon consideration of the following detailed disclosure thereof when taken in conjunction with the accompanying drawing.

DESCRIPTION OF THE DRAWING

In the drawing:

The FIGURE is a graphical illustration showing the ferrimagnetic resonance spectra for two samples of the ferrite single crystals contemplated by this invention.

DETAILED DESCRIPTION OF THE PREFERRED EMBODIMENT

Pursuant to the above-defined objects, the present invention concerns itself with hexagonal ferrite single crystals and to a method of preparing such crystals that are uniquely characterized by processing a strong uniaxial anisotropy. By the proper selection and control of precise processing parameters, the internal magnetic field associated with ferrites can be adjusted to provide a desired center frequency, and maintain a metastable state of magnetic saturation without the necessity for applying an external biasing magnetic field as is presently required when using ferrite resonators.

The outstanding features of hexagonal ferrites are their high uniaxial anisotropies combined with the low-loss characteristics typical of ferrites. This combination of properties is useful in a number of applications; so it is not surprising that these materials have been studied extensively. Many applications, such as permanent magnets, employ the ferrites in ceramic form. Other applications, however, require single crystals. This is true for the devices such as tunable filters operating at higher microwave and millimeter-wave frequencies. In these devices, single crystals provide the lowest losses and, therefore, the narrowest resonance linewidths. The high uniaxial anisotropy provides an internal magnetic field which greatly reduces the magnitude of the externally supplied field required for resonance at millimeter-wave frequencies.

Unfortunately, the preparation of ferrite crystals having the requisite properties that make them especially valuable for use as ferrite resonators is extremely difficult. Traditionally, both methods have been employed to prepare high quality device material. However, difficulties arise because of intrinsic characteristics of the ferrites and from limitations imposed by the particular growth methods utilized. With this invention, however, the difficulties encountered in the preparation of hexagonal ferrites with bulk growth techniques has been circumvented by using the isothermal dipping method of liquid phase epitaxy, otherwise referred to as the LPE method. It has been found, however, that the technique of this invention, is successful only when precisely controlled and carefully selected processing parameters are utilized. The invention produces an M-type (BaO.6-Fe$_2$O$_3$) hexagonal ferrite single crystal deposited on a [111] oriented Mg(In,Ga)$_2$O$_4$ substrate which, when tested, shows the attainment of fairly narrow ferrimagnetic resonance linewidths at 35 GHz and tunable filter operating to 60 GHz.

The hexagonal ferrites of which this invention is concerned belong to the pseudo-ternary system BaO-Fe$_2$O$_3$-ZnO. The simplest of these hexagonal ferrites is, as already mentioned, the M-type which contains no ZnO. This composition is also called barium hexaferrite from its 1:6 stoichiometry, BaO.6F$_3$2O$_3$.

M is the end member of two crystallographically distinct families of hexagonal ferrites. The other end members are designated Y and S. Y is a hexagonal ferrite having the chemical formula 2BaO.2ZnO.6Fe$_2$O$_3$. S is not a hexagonal ferrite. It is a spinel ferrite having cubic crystal structure. The chemical formula of S is conveniently written as twice the usual formula unit; that is Zn$_2$Fe$_4$O$_8$ or 2ZnO.2Fe$_2$O$_3$. The chemical formulas of all hexagonal ferrites can be expressed as linear combinations of M and S or of M and Y. For example, the important W-type which has the formula BaO.2ZnO.8Fe$_2$O$_3$, is equivalent to MS; that is, one M unit plus one S unit. In the M-S family, W is the hexagonal ferrite having the highest concentration of ZnO; the mole ratio of ZnO/Fe$_2$O$_3$=0.25.

The description of hexagonal ferrites in terms of M and S or M and Y applies not only to their chemical formulas, but to their crystal structures as well. M, S and Y are crystallographic blocks which may be stacked in various sequences to generate the unit cells of the different hexagonal ferrite types. The common feature of these blocks, which permits this stacking, is that they consist basically of close packed oxygen layers with the same interatomic spacings within the layers. The S block consists of two oxygen layers, parallel to the cubic spinel (111) plane. The small cations, Fe and Zn, occupy octahedral and tetrahedral interstices formed by the oxygen ions. The M block consists of five oxygen layers, parallel to the hexagonal plane, with Ba ions replacing one fourth of the oxygens in one of the five layers. Again, the smaller cations are accommodated interstitially. The Y block is similar to the M, but consists of six oxygen layers with Ba ions replacing one fourth of the oxygens in two adjacent layers.

If there were only a few hexagonal ferrite types, the description in terms of M-S and M-Y stacking sequences would be of only slight interest. The fact is, however, that there are several known members of the M-S family and several dozen known members of M-Y. Included in M-Y are the largest unit cells in inorganic crystallography. The hexagonal ferrite M$_4$Y$_{33}$, for example, has chemical formula Ba$_{70}$Zn$_{66}$Fe$_{444}$O$_{802}$ with a unit cell containing over 4100 atoms and having a c-axis lattice parameter of 1577 Å. More significant than the size of the unit cells, however, is the fact that the many hexagonal ferrites are distinguished from each other by relatively minor differences in stoichiometry and crystal structure. Yet stoichiometry and crystal structure may have profound effects on magnetic properties. With conventional bulk crystal techniques, growth conditions are continuously changing so that several different hexagonal ferrite types may be produced. A single bulk crystal may even change its type (that is, change its stacking sequence) as it grows. The LPE method provides nearly constant growth conditions so that uniform crystals may be produced more easily.

Epitaxial growth requires a deposition process and a suitable substrate. In the isothermal dipping method of LPE, the melt composition is given in terms of three mole ratios for the ingredients; namely, the mole ratio of BaCO$_3$/B$_2$O$_3$, the ratio of Fe$_2$O$_3$/(BaCO$_3$+B$_2$O$_3$) and the ratio of ZnO/F$_2$O$_3$. The solute (BaO, Fe$_2$O$_3$ and ZnO) is dissolved in a solvent or flux (molten BaO and B$_2$O$_3$). (Actually, BaCO$_3$ is used as the starting material rather than BaO) The solution, or melt, is homogenized at a high temperature and then cooled until a supersaturated state is achieved. With the temperature held constant, a pre-heated substrate crystal is immersed in the supersaturated melt. The substrate is kept in the melt for a suitable period of time, several minutes to several hours, during which a hexagonal ferrite layer is deposited. The substrate with its deposit is then removed from the melt and cleaned in hot dilute acetic acid.

By varying the melt composition, especially the ZnO concentration, three different hexagonal ferrite types may be deposited: M, Y and W. Two classes of substrates can be used successfully: hexagonal ferrites of the M-type and non-magnetic spinels. With M-type substrates, however, the deposition is homoepitaxy (M deposited on M) or quasi-homoepitaxy (Y or W on M) analogous to the change in type exhibited in bulk crystals. With spinel substrates, the deposition was heteroepitaxy; but, as previously described, the spinel (or S block) structure is closely related to the hexagonal ferrite structure. The spinel lattice parameter whould be about 8.33 Å if the distance between oxygen ions is to match that in hexagonal ferrites.

With spinel substrates, such as $Mg(In,Ga)_2O_4$ spinels, no deposition occurred when the ZnO concentration was low. At the other extreme, high ZnO concentration, the S phase ($Zn_2Fe_4O_8$) deposited epitaxially along with some hexagonal ferrite. For intermediate values of ZnO concentration, deposits consisting only of hexagonal ferrite were obtained. In all these cases, when hexagonal ferrite deposited it did so in the form of oriented hexagonal islands. The epitaxial relation of the islands deduced from X-ray diffraction and from crystal morphologies, was found to be: hexagonal ferrite basal plane parallel to spinel substrate (111) and hexagonal a-axis parallel to spinel [101]. Although the deposits were in the form of islands, nearly complete coverage of the substrate was obtained for a narrow range of ZnO concentration. However, $(Mg(In,Ga)_2O_4$ must be lattice matched to hexagonal ferrite by adjusting the In:Ga ratio.

Another observation is that cut and polished $Mg(In,Ga)_2O_4$ substrates are superior to natural (111) surfaces. All of the substrate crystals used in the invention were grown by conventional flux methods. The spinel crystals usually have octahedral morphologies with large (111) facets. Since the crystals are typically small, a few mm in diameter, they have generally been used as substrates in their "as-grown" state. However, a few cm-size polished $Mg(In,Ga)_2O_4$ wafers were prepared. Hexagonal ferrite deposition occurs more readily on these wafers than on natural facets. By using a melt composition of $BaCO_3/B_2O_3 = 1.75, Fe_2O_3/(BaCO_3+B_2O_3)=0.164$ and $ZnO/Fe_2O_3=0.100$, continuous M-type layers, which cover large areas of the polished substrates were obtained. These layers were grown at deposition temperatures in the range of 911° C. to 921° C. The undercooling is not known precisely; but is at least 40° C. at 921° C.

The hexagonal ferrite deposits have not been of sufficiently high quality to permit precise measurements of lattice parameter. However, the c-axis parameter has been calculated from X-ray diffractograms using the spinel substrates as internal standards. (Substrate lattice parameters were measured by conventional X-ray powder methods.) In all cases, the c-axis lattice parameter has been found to be slightly smaller than the literature value of 23.194 Å. The differences, ranging from 0.01% to 0.1% could be due to unrelieved misfit strain. Since the substrates used have lattice parameters slightly larger than the value required for exact matching, the deposits may experience a small tensile strain parallel to the surface with a corresponding compressive component along the c-axis. The tensile component could result in cracking of the deposit and cracks have been observed.

Ferrimagnetic resonance (FMR) measurements were made at 35 GHz using a standard reflection cavity microwave system. M-type deposits were studied in perpendicular resonance; that is, with the applied magnetic field in the c-axis direction normal to the layer surface. Because of the high uniaxial anisotropy of these hexagonal ferrites, parallel resonance could not be observed at fields within the range of the magnet.

The FIGURE in the drawing shows representative FMR spectra at 35 GHz for two samples of M-type hexagonal ferrite deposited at 911° C. on polished $Mg(In,Ga)_2O_4$ substrate wafers. The spectra were obtained after the applied field had been increased to a value of a few K Oe and then reduced to zero before beginning the sweep. If the as-grown layers were measured without first applying a large field, no resonances were observed. After applying the large field and obtaining the spectra, behavior similar to that of the as-grown state could be recovered by applying a large in-plane field or a small field of reverse polarity. Thus, it appears that the layers must be magnetically saturated if resonance at 35 GHz is to be observed.

Although the two spectra in the FIGURE are far from identical, there are certain common features. Each shows several resonances at fields of several hundred oersted. The principal resonances have half power linewidths of 30 Oe. When polished substrate wafers are used, good reproducibility has been observed, and similar spectra have been obtained. Sometimes, additional resonances at higher fields have been found. These seem to be due to portions of the deposit which contain plates of other orientations; that is, portions of the deposit are not aligned for perpendicular resonances.

In addition to the FMR studies, measurements of reflected power were made across the 40–60 GHz range using a shorted waveguide technique. Linear tuning of the resonant absorption was observed. For the samples shown in the FIGURE, a field of approximately 9 KOe was required to tune the absorption to 60 GHz. Extrapolation to zero applied field gave a self resonance at 32.5 GHz.

The present invention shows that the hexagonal ferrites grown by this LPE method have the same fundamental properties as materials grown by conventional methods. Allowing for the fact that our layer samples experience a demagnetizing field of $4\pi M$, the observed values of resonance field are consistent with literature values for anisotropy field and magnetization of the M-type hexagonal ferrites. The values for linewidth compare favorably with the best reported values for uniaxial hexagonal ferrite bulk crystals. Moreover, the linewidth values seem to be quite reproducible when polished substrate wafers are used.

The presence of several resonances in each spectrum and the variability among spectra (such as the differences between the two spectra in the FIGURE) are probably related to the fact that individual scale-like or plate-like regions resonate independently. Since these regions differ slightly in orientation, and perhaps in other parameters, each may resonate at a slightly different field value. This may account, in part, for the presence of multiple resonance modes in the spectra. Furthermore, as was previously described, it appears to be necessary to saturate the deposit in order to see resonances. Since $4\pi M$ at room temperature is nearly 5 KG, one might think that the samples would be unsaturated at the resonance fields of the (FIGURE) of less than 1 KOe. However, the values of resonance field are consistent with the equation for perpendicular resonance in a saturated disc $(\omega/\gamma)+H_o+H_A-4\pi M$, where $H_o$ is the applied field and $H_A$ is the anisotropy field. It is believed that relatively defect-free regions of the deposit are able to remain saturated when the applied field is reduced to zero because it is difficult for reversal domains to nucleate in such regions. If the interpretation is correct, then resonance at 35 GHz is observed only for these relatively perfect regions.

The critical part of the present invention is the attainment of a metastable saturated state. This requires that the ferrite be a small, single crystal with strong uniaxial anisotropy. The crystal must also be perfect to the extent that there is an absence of centers where magnetic domains can nucleate easily. Such a crystal can be magnetically saturated by applying a large magnetic field along the easy axis of anistropy. Upon removal of the external field, the absence of nucleation centers will prevent the development of a magnetic domain structure and saturation will be retained. These conditions are related to the properties which make a good permanent magnet: high remanance and high coercivity.

With the present invention, the required properties referred to above have been obtained with LPE films of M-type hexagonal ferrite deposited on (111) Mg(In,-Ga)$_2$O$_4$ substrates. In these crystals, the easy axis is the C-axis normal to the film and the anisotropy is very strong. Although the films are fairly large in lateral extent, they actually consist of small individual, plate-like crystals which have grown together. Ferrimagnetic resonance measurements at 35 GHz show no strong resonance until the material has been subjected to a strong external field, 2.7 KOe, parallel to the c-axis. When the field is reduced, sharp resonances, with half-power linewidths, 30 Oe, are observed for fields of a few hundred Oe. These resonances can be reproducibly observed until the sample is subjected to a large field in another direction (perpendicular to the c-axis). The sharp resonances can be recovered by reapplying the large field parallel to the c-axis. It is belived that the resonance signals arise from small regions of the hexagonal ferrite deposit. These regions must be sufficiently perfect that domains are not easily nucleated. The farily narrow linewidth (30 Oe) suggests high crystal quality.

Measurements at 50-60 GHz, where the applied fields saturate the entire deposit, gave linewidths of several hundred Oe. Presumably, in this case, less perfect regions of the ferrite contribute to the signal.

While the invention has been described with particularity in reference to a specific embodiment thereof, it should be understood that the disclosure of the present invention is for the purpose of illustration only and is not intended to limit the invention in any way, the scope of which is defined by the appended claims.

What is claimed is:

1. A method for preparing an M-type, self-biased, hexagonal ferrite resonator composed of single crystals of barium hexaferrite on a spinel substrate which comprises the steps of:

A. forming a homogenized, supersaturated melt composition by dissolving a solute composed of a mixture of Ba O, Fe$_2$O$_3$ and ZnO into a molten flux composed of Ba CO$_3$ and B$_2$O$_3$ in which the mole ratio of B$_a$CO$_3$: B$_2$O$_3$ is 1.75, the mole ratio of Fe$_2$O$_3$: (B$_a$CO$_3$+B$_2$O$_3$) is 0.164, and the mole ratio of Zn O: Fe$_2$O$_3$ is 0.100;

B. maintaining said melt composition at a temperature of from about 911° C. to 921° C. while simultaneously immersing a Mg (In, Ga)$_2$O$_4$ spinel substrate into said melt composition for a period of time sufficient to effect the deposition on the surface of said substrate of barium hexaferrite single crystals that are substantially free of defects which can act as nucleation sites for magnetic domains;

C. subjecting said single crystals to a magnetic field that is directed along the easy axis of anisotropy of said crystals and of sufficient magnitude to produce magnetic saturation in said crystals; and D. reducing said magnetic field to zero to produce single crystals capable of being maintained in a metastable state of magnetic saturation with zero applied field.

* * * * *